United States Patent
Gebhardt

(10) Patent No.: US 11,372,087 B2
(45) Date of Patent: Jun. 28, 2022

(54) RADAR SYSTEM AND METHOD FOR RECEIVING AND ANALYZING RADAR SIGNALS

(71) Applicant: Aptiv Technologies Limited, St. Michael (BB)

(72) Inventor: Patrik Gebhardt, Schwelm (DE)

(73) Assignee: Aptiv Technologies Limited, St. Michael (BB)

( * ) Notice: Subject to any disclaimer, the term of this patent is extended or adjusted under 35 U.S.C. 154(b) by 620 days.

(21) Appl. No.: 16/382,789

(22) Filed: Apr. 12, 2019

(65) Prior Publication Data
US 2019/0353753 A1 Nov. 21, 2019

(30) Foreign Application Priority Data
May 18, 2018 (EP) ...................... 8173197

(51) Int. Cl.
| G01S 7/41 | (2006.01) |
| H03M 7/30 | (2006.01) |
| G01S 7/00 | (2006.01) |

(52) U.S. Cl.
CPC ........... *G01S 7/417* (2013.01); *H03M 7/3059* (2013.01); *G01S 7/003* (2013.01)

(58) Field of Classification Search
CPC ............ G01S 7/417; G01S 2013/9327; G01S 13/931; G01S 13/87; G01S 7/003; G01S 7/02; G06N 3/0454; G06N 3/08; H03M 7/30; H03M 7/3059
See application file for complete search history.

(56) References Cited

U.S. PATENT DOCUMENTS

| 6,091,773 A * | 7/2000 | Sydorenko .............. G06T 9/002 375/240.03 |
| 7,415,162 B2 * | 8/2008 | Suzuki ................. H04N 19/176 382/246 |
| 11,189,028 B1 * | 11/2021 | Kearney ................... G06N 3/08 |
| 2003/0169928 A1 * | 9/2003 | Stanek ..................... G06T 9/005 382/232 |
| 2015/0139500 A1 * | 5/2015 | Gerster ..................... H04N 5/14 382/104 |
| 2018/0089505 A1 * | 3/2018 | El-Khamy ................ G06T 7/11 |
| 2018/0314985 A1 | 11/2018 | O'Shea |

FOREIGN PATENT DOCUMENTS

WO 2018/106805 A1 6/2018

OTHER PUBLICATIONS

Liou, et al., "Modeling word perception using the Elman network", Jul. 2008, 9 pages.

* cited by examiner

*Primary Examiner* — Erin F Heard
*Assistant Examiner* — Juliana Cross
(74) *Attorney, Agent, or Firm* — Sawtooth Patent Group PLLC

(57) ABSTRACT

A radar system suitable for an automated vehicle comprises at least one receiving element configured to detect reflected radar signals reflected by an object in a field-of-view of the system. The receiving element is further configured to generate detected signals indicative of the reflected radar signals detected by the receiving element. Furthermore, an auto-encoding device performing an auto-encoding operation on the detected signals is embedded in the receiving element such that the receiving element outputs the detected signals in an encoded form.

20 Claims, 3 Drawing Sheets

RADAR SYSTEM AND METHOD FOR RECEIVING AND ANALYZING RADAR SIGNALS

TECHNICAL FIELD OF INVENTION

This disclosure generally relates to a a radar system suitable for an automated vehicle and to a method for receiving and analyzing radar signals.

BACKGROUND OF INVENTION

Radar systems are used for many automotive applications, e.g. for advanced driver assistant systems (ADAS) comprising automatic cruise control (ACC) and/or automatic emergency breaking (AEB). Common radar sensors of such systems, like front facing or side facing radar sensors, provide sensor information in terms of so-called detection lists. These lists comprise properties of physical detections performed on the data signals of the radar sensors. Typically, a detection list comprises the properties of approximately 64 to 128 physical detections. A single detection consists of range, angle, amplitude and velocity information of a target at which a radar signal sent by the radar system is reflected.

Although the detection lists are sufficient for the traditional driver assistant systems, more sophisticated applications, like classification of pedestrians, bicycles or landmarks, require more detailed information being already present in the raw signals of the radar sensors. Therefore, a larger quantity of data needs to be transferred to a data processing unit for these sophisticated applications. For a data transfer suitable for such applications, instead of detection lists another data format is used which is called compressed data cube (CDC). The three-dimensional raw data of radar sensors of a target are compressed for the CDC by applying thresholds corresponding to noise levels of the radar signals. Due to the sparse nature of the radar raw signals, a strong compression of these data is achieved by the compressed data cube. Such a compression is necessary since it is not possible to transfer an uncompressed data cube via the data transmission protocols which are currently available in automotive systems.

The data compression within a compressed data cube is therefore based on the assumption that signals below the noise level being arbitrarily defined do not contain any relevant information. This assumption is not necessarily true since there are algorithms being able to reduce the effect of noise and to reveal information below noise level. In addition, object classification algorithms being based on learning or training procedures can be applied more effectively to unmodified raw signals. Furthermore, a compression based on thresholds corresponding to noise levels can introduce harmful artifacts to the transmitted signals.

SUMMARY OF THE INVENTION

Described herein are techniques for providing a radar system and a method for receiving and analyzing radar data which provide a sufficient high transfer rate for all relevant information contained in radar raw signals and required by a special application.

According to one embodiment, the radar system comprises at least one receiving element which is configured to detect reflected radar signals being reflected by an object in a field-of-view of the system. The receiving element is further configured to generate detected signals indicative of the reflected radar signals detected by the receiving element. Furthermore, an auto-encoding device performs an auto-encoding operation on the detected signals and is embedded in the receiving element. Therefore, the receiving element outputs the detected signals in an encoded form.

The encoded form of the detected signals is preferably a lossy encoded form. This means that data being reconstructed from the encoded detected signals can differ from the original detected signals. However, the data loss due to the encoding and reconstructing of the detected signals is to be minimized, e.g. by a training procedure.

Since the auto-encoding device is embedded in the receiving element, a compact unit for receiving and encoding the reflected or raw radar signals is achieved. Such a compact receiving and encoding unit can be easily implemented in automotive applications and already provides encoded data without the need for an additional encoding device.

The output of the receiving element can also be denoted as an "intermediate representation" of the detected signals. Due to the encoding of the data, the quantity of data to be transferred is generally decreased. Therefore, the information provided by the reflected radar signals can be transferred with a higher transfer rate at the output of the receiving device, i.e. in comparison to a receiving element which does not output encoded data. The "dimensionality" of the intermediate representation, i.e. the maximum quantity of data or number of samples, can therefore be specified in accordance with the available transmission bandwidth of a respective interface which is to be used for transferring the encoded signals. In addition, no artifacts due to arbitrarily defined thresholds are introduced when encoding and transferring the detected signals.

Due to the encoding of the original detected signals, the detected signals are compressed when they are output by the receiving element. A compression factor can be defined as the ratio of samples of the original detected signals to the number of samples or corresponding data sets of the encoded detected signals. Therefore, the compression factor is a measure for reducing the quantity of data to be transferred or, vice versa, a measure for the enhancement of the data transfer rate at the output of the receiving element.

It should be noted that the original detected signals are signals which are directly generated e.g. by antennas of the receiving element. That is, these data are regarded as raw data which have not yet been exposed to further processing steps, like one or more Fourier transforms which are typically used to create e.g. a Range-Doppler-Map.

In accordance with an advantageous embodiment, the system further comprises a transfer device in communication with the receiving element and a controller in communication with the transfer device. The transfer device transfers the encoded detected signals from the receiving element to the controller, whereas the controller comprises a decoding device which performs a decoding operation in order to decode the encoded detected signals.

Since the quantity of data output by the receiving element is decreased due to the encoding, a standard transfer device, like e.g. CAN-bus, can be used for the data transfer. Such a transfer device is usually available in an automotive application or an automated vehicle. Thus, the requirements regarding the transfer device, e.g. with respect to the data transfer rate, are reduced due to the encoding. The decoding device comprised by the controller is preferably the counterpart of the auto-encoding device since the decoding device has to reconstruct the detected signals with a minimum deviation with respect to the original detected signals.

In particular, the auto-encoding device applies a first non-linear function to the detected signals in order to encode the detected signals, whereas the decoding device applies a second non-linear function for decoding the encoded detected signals. Due to the reconstruction requirement for the decoding device with respect to the detected signals, the first and second non-linear functions depend on each other. Therefore, the properties of the data transfer, e.g. regarding an unavoidable data loss, can be assessed and/or controlled by the properties of the non-linear functions. This can be performed, for example, by controlling parameters which the non-linear functions depend on. Preferably, the first non-linear function is different from the second non-linear function.

In accordance with a further embodiment, a first neural network derives parameters of the first non-linear function which is applied in the auto-encoding operation, whereas a second neural network derives parameters of the second non-linear function which is applied in the decoding operation. The first and second neural networks can be implemented on a development system which is used before installing the radar system e.g. on an automated vehicle. Alternatively, the first and second neural networks can be implemented on the controller which is part of the radar system.

Since the first and second non-linear functions depend on each other, the first and second neural networks are may be connected to each other, i.e. due to the reconstruction requirement. In particular, convolutional neural networks are well suited for processing radar raw data. Therefore, the set of parameters for the first and second non-linear functions can be regarded as one set of parameters which are defined by the first and second neural networks.

Preferably, the controller comprises a discriminator which evaluates the parameters of the first and second non-linear functions as part of a training procedure of the auto-encoding and decoding devices. The task of the discriminator is therefore evaluating the parameters of the first and second non-linear functions in such a manner that the difference between the original detected signals and the reconstructed signals is minimized. In a testing environment, i.e. before implementing the radar system on a vehicle, the discriminator receives the original detected signals or raw signals during training procedure without encoding from the receiving element as well as the encoded and decoded, i.e. reconstructed, detected signals.

During the training procedure, the parameters of the first and second non-linear functions are varied by the first and second neural networks until the original and the reconstructed signals coincide sufficiently with each other. A residual deviation between the original and reconstructed signals can be defined in order to terminate the training procedure. In addition, the residual deviation can be defined in such a manner that the amount of data to be transferred is reduced as far as possible, or that the relevant information obtained by the data is maximized.

In particular, the controller comprises at least one application algorithm for analyzing the detected signals, and the discriminator uses the application algorithm during the training procedure in order to evaluate the parameters for the first and second non-linear functions. Preferably, the at least one application algorithm comprises at least one algorithm for landmark classification, pedestrian classification and/or bicycle classification. Furthermore, the results provided by the at least one application algorithm can be further processed by other automotive applications, e.g. by a advanced driver assistant system (ADAS).

Instead of comparing the original and reconstructed raw signals directly, the application algorithm can be used during the training procedure for the evaluation of the parameters of the first and second non-linear functions. For example, an algorithm for identifying or classifying an object can be applied on the original detected signals and on the reconstructed signals, e.g. for identifying a landmark or a pedestrian, and the training procedure will end if there is sufficient consistency regarding the identification results.

By these means, the training procedure can be tailored and optimized with respect to the required application for which the radar signals are detected. Besides, the unavoidable data loss due to the auto-encoding and decoding operations can therefore be minimized with respect to the required application, e.g. identification of objects, instead of defining an arbitrary level, e.g. noise level, for restricting the quantity of data to be transferred. Thus, the unavoidable data loss is "transferred" to irrelevant data with respect to the required application by the training procedure.

In particular, the training procedure is performed before installing the radar system on an automated vehicle by applying a large number of data sets, i.e. detected signals from known objects in original form as well as in encoded and decoded form. However, during operation of the radar system in an automated vehicle, a training procedure can preferably be repeated in order to verify the parameters of the first and second non-linear functions. For example, a training procedure can be triggered when the transfer device allows a transfer of a large quantity of data, e.g. when the vehicle is not moving.

Another aspect relates to a receiving element for detecting radar signals which can be used in the radar system described above. The receiving element comprises an embedded auto-encoding device which encodes detected signals being output by the receiving element.

Furthermore, another aspect relates to a method for receiving and analyzing radar signals. Reflected radar signals which are reflected by an object in a field-of-view of a radar system are detected via at least one receiving element. The detected signals are auto-encoded via an auto-encoding device being embedded in the receiving element. Thereafter, the encoded radar signals are transferred to a controller and decoded via a decoding device which is comprised by the controller. The decoded radar signals are finally analyzed via at least one application algorithm comprised by the controller.

Due to the auto-encoding and decoding steps, the quantity of data to be transferred from the receiving element to the controller can be decreased. Therefore, the transfer rate for the relevant information can be increased. Furthermore, the occurrence of artifacts in reconstructed or decoded radar signals can be minimized since no arbitrary restrictions for the data, like noise levels, are used.

Further features and advantages will appear more clearly on a reading of the following detailed description of the preferred embodiment, which is given by way of non-limiting example only and with reference to the accompanying drawings.

BRIEF DESCRIPTION OF DRAWINGS

Further details will now be described, by way of example with reference to the accompanying drawings, in which.

DETAILED DESCRIPTION

Reference will now be made in detail to embodiments, examples of which are illustrated in the accompanying drawings. In the following detailed description, numerous specific details are set forth in order to provide a thorough understanding of the various described embodiments. However, it will be apparent to one of ordinary skill in the art that the various described embodiments may be practiced without these specific details. In other instances, well-known methods, procedures, components, circuits, and networks have not been described in detail so as not to unnecessarily obscure aspects of the embodiments.

'One or more' includes a function being performed by one element, a function being performed by more than one element, e.g., in a distributed fashion, several functions being performed by one element, several functions being performed by several elements, or any combination of the above.

It will also be understood that, although the terms first, second, etc. are, in some instances, used herein to describe various elements, these elements should not be limited by these terms. These terms are only used to distinguish one element from another. For example, a first contact could be termed a second contact, and, similarly, a second contact could be termed a first contact, without departing from the scope of the various described embodiments. The first contact and the second contact are both contacts, but they are not the same contact.

The terminology used in the description of the various described embodiments herein is for describing embodiments only and is not intended to be limiting. As used in the description of the various described embodiments and the appended claims, the singular forms "a", "an" and "the" are intended to include the plural forms as well, unless the context clearly indicates otherwise. It will also be understood that the term "and/or" as used herein refers to and encompasses all possible combinations of one or more of the associated listed items. It will be further understood that the terms "includes," "including," "comprises," and/or "comprising," when used in this specification, specify the presence of stated features, integers, steps, operations, elements, and/or components, but do not preclude the presence or addition of one or more other features, integers, steps, operations, elements, components, and/or groups thereof.

As used herein, the term "if" is, optionally, construed to mean "when" or "upon" or "in response to determining" or "in response to detecting," depending on the context. Similarly, the phrase "if it is determined" or "if [a stated condition or event] is detected" is, optionally, construed to mean "upon determining" or "in response to determining" or "upon detecting [the stated condition or event]" or "in response to detecting [the stated condition or event]," depending on the context.

Figure 1:
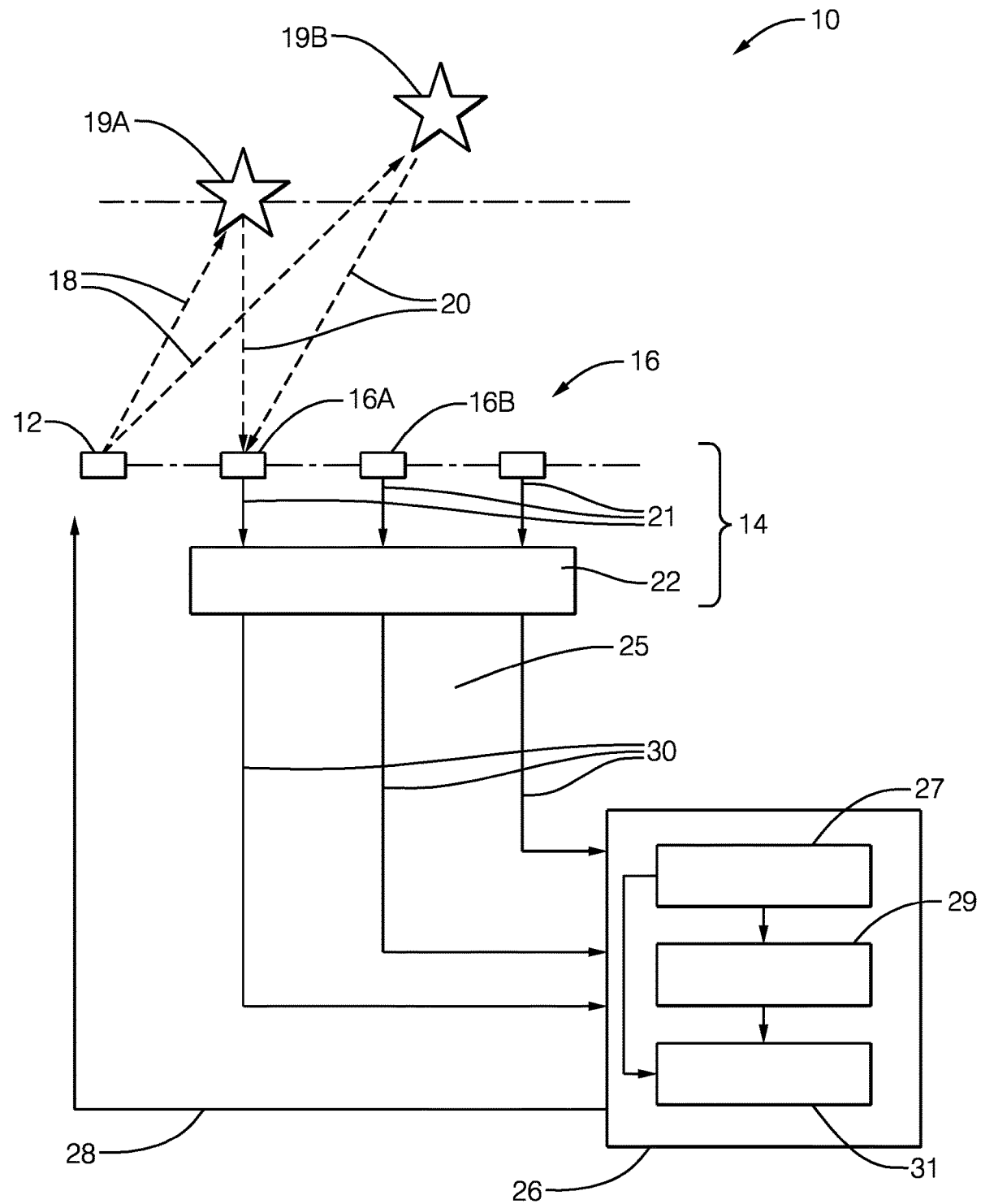
FIG. 1 is a vehicle-based radar system in accordance with one embodiment.

FIG. 1 illustrates a vehicle-based radar system, hereinafter referred to as the system 10. The system 10 includes a transmit element 12 and at least one receiving element 14 comprising a plurality of antennas 16, e.g. a first antenna 16A and a second antenna 16B. The transmit element 12 transmits a radar signal 18 which is reflected by a first object 19A and/or a second object 19B in a field-of-view of the system 10 as reflected radar signals 20. The reflected radar signals 20 are detected by the first antenna 16A and second antenna 16B of the receiving element 14 in order to provide detected signals 21 indicative of the reflected radar signals 20.

In addition, the receiving element 14 comprises an auto-encoding device 22. In other words, the auto-encoding device 22 is embedded in the receiving element 14 in order to provide a compact unit together with the antennas 16. The auto-encoding device 22 performs an auto-encoding operation on the detected signals 21 by applying a first non-linear function 103 (see FIG. 3) to the detected signals 21. Therefore, encoded detected signals 30 are output by the auto-encoding device 22. In summary, the receiving element 14 comprising the embedded auto-encoding device 22 outputs the encoded detected signals 30 instead of the original detected signals 21.

Figure 2:
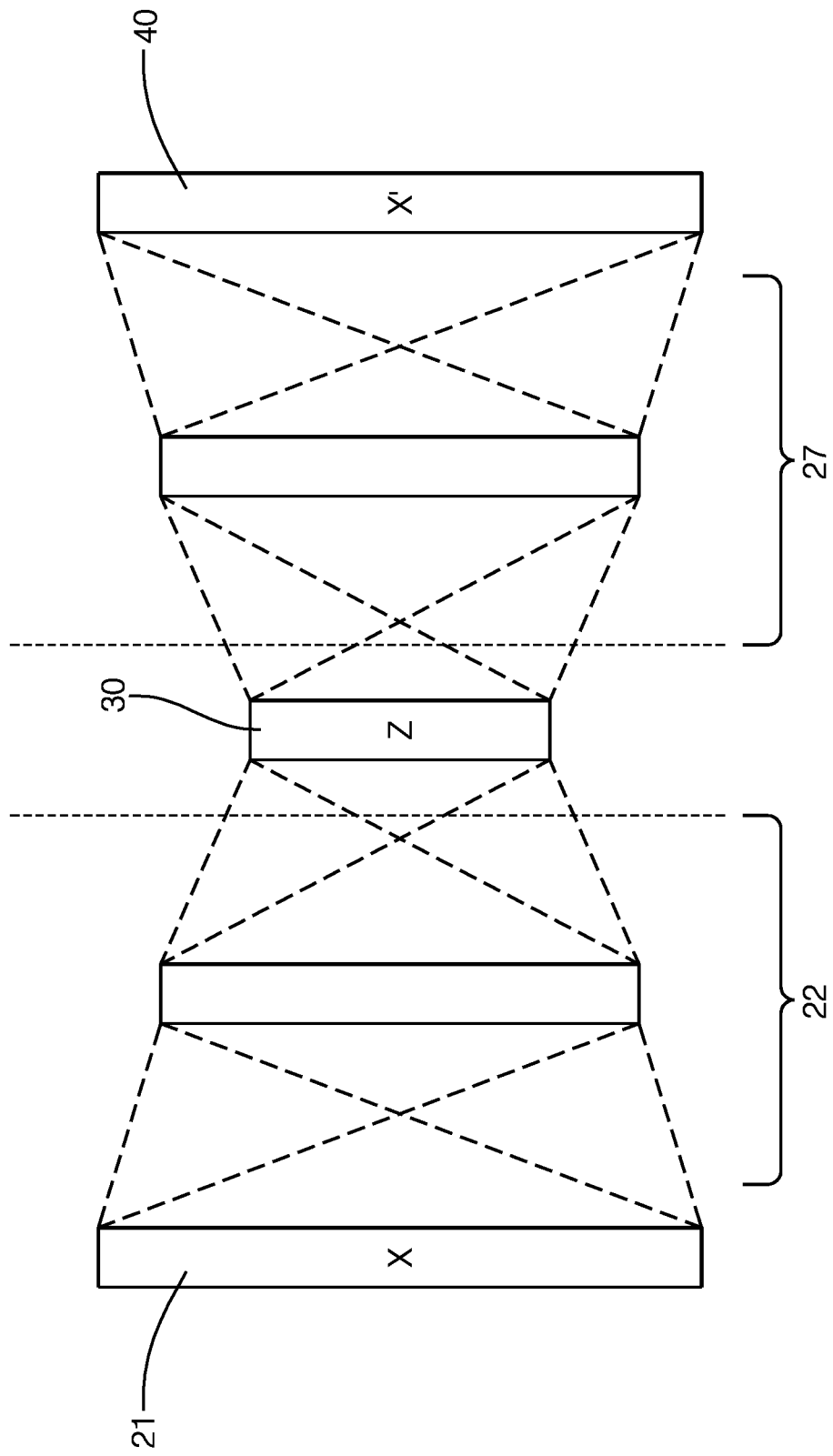
FIG. 2 is a schematic representation of data compression and data reconstruction performed by the system of FIG. 1.

Due to the encoding of the detected signals 21, a data compression of these signals is performed as illustrated on the left side of FIG. 2. As radar sensors, the antennas 16 have a typical sampling rate of 100 to 1000 MHz with a typical resolution of 16 bit. One single scan of the detected signals 21 provides an input X for the auto-encoding device 22 consisting of 1000 to 10000 samples. Due to the auto-encoding by the auto-encoding device 22, the encoded detected signals 30 are obtained as a so-called intermediate representation Z comprising a much smaller quantity of data, e.g. several hundred samples only. In this example, this leads to a compression factor of approximately 10 for the detected signals 21 due to the auto-encoding.

The system 10 further comprises a transfer device 25 in communication with the receiving element 14 and a controller 26 in communication with the transfer device 25. The transfer device 25 transfers the encoded detected signals 30 from the receiver element 14 to the controller 26. The controller 26 comprises a decoding device 27, a discriminator 29 and an application algorithm 31 to be applied to the detected signals. In addition, the controller 26 comprises a device (not shown) for providing a transmit signal 28 to the transmit element 12 in order to generate the radar signal 18.

The transfer device 25 is, for example, a CAN-bus used in typical automotive systems. The transfer device 25 transfers the encoded detected signals 30 from the receiving element 14 to the decoding device 27 of the controller 26. The decoding device 27 performs a decoding operation by applying a second non-linear function 203 (see FIG. 3) to the encoded detected signals 30.

The decoding operation performed by the decoding device 27 is illustrated on the right side of FIG. 2. By applying the second non-linear function 203 to the encoded detected signals 30 (or intermediate representation Z), decoded or reconstructed signals 40 are generated as output X' of the decoding device 27. Due to the application of the non-linear functions 103, 203 to the original and encoded signals, an unavoidable data loss occurs, i.e. the decoded or reconstructed signals 40 may deviate from the original detected signals 21. However, no arbitrary restrictions (e.g. thresholds corresponding to noise levels) are applied to the signals. Instead, parameters of the non-linear functions 103, 203 are optimized by a training procedure.

In a first mode of operation of the system 10, i.e. during the training procedure, the output X' of the decoding device 27, i.e. the decoded signals 40, is used as input for the discriminator 29 which evaluates parameters of the first and second non-linear function which are applied within the encoding and decoding steps. This evaluation is performed by transferring the original detected signals 21 to the controller 26 as well.

In a first form of the evaluation, the decoded signals 40 are compared to the original detected signals 21 and the parameters of the first and second non-linear functions 103, 203 are varied until the deviation between the original detected signals 21 and the decoded signals 40 is minimized. In a second form of the evaluation, the application algorithm 31 (which is generally to be applied to the detected signals 21) is additionally included in the evaluation step. That is, the application algorithm 31 is applied to the detected signals 21 and to the decoded signals 40, respectively, and a comparison of the results is performed afterwards. By this means, the discrimination step performed by the discriminator 29 can be adapted to the application algorithm 31 being provided for the detected signals 21.

Figure 3:
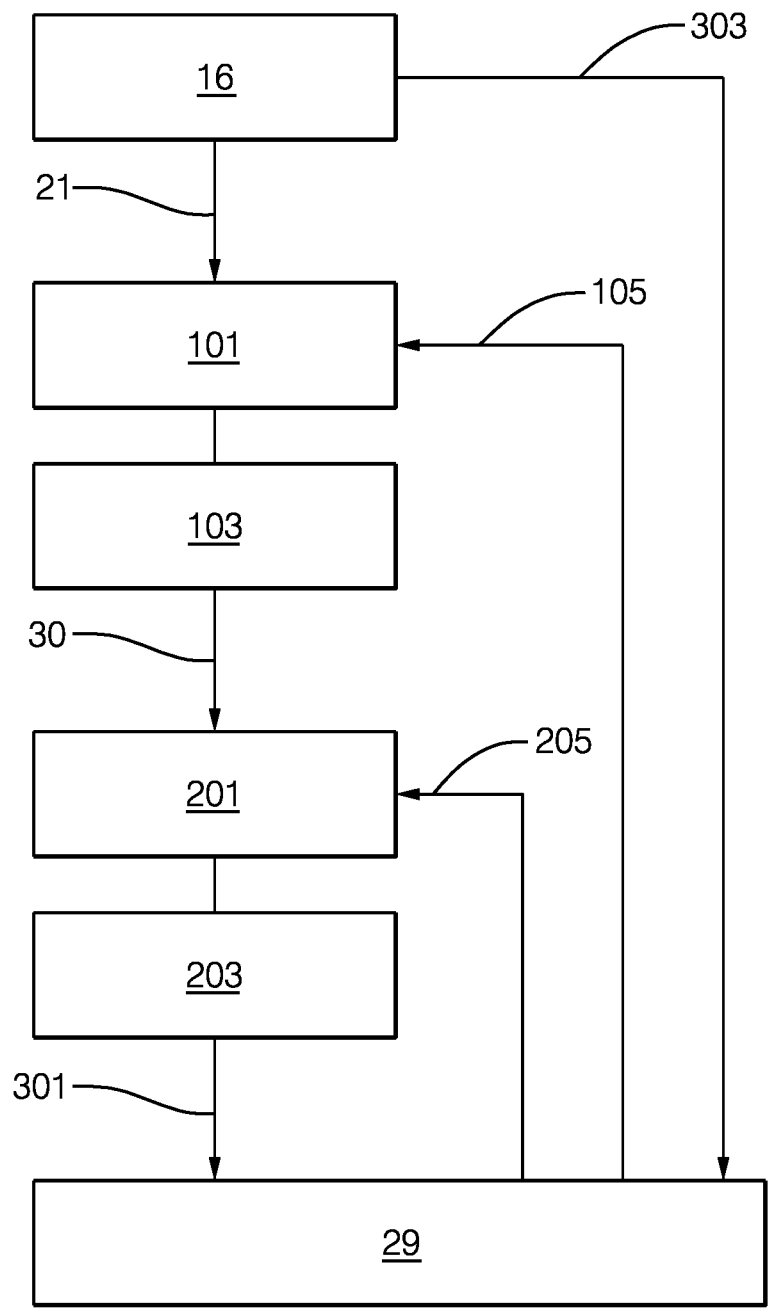
FIG. 3 is a flow chart illustrating a training procedure performed for the system of FIG. 1.

In both forms of the discrimination step, a comparison of original and reconstructed signals is used for evaluating and controlling the parameters of the first and second non-linear functions. Due to this, data having no or minor relevance is automatically suppressed by the discrimination. The evaluation of the parameters for the first and second non-linear functions 103, 203 is performed until the deviation between the original and reconstructed signals (i.e. raw signals or application results) is minimized. In detail, the evaluation is performed via a training procedure as illustrated in FIG. 3.

According to the training procedure, the output of the antennas 16, i.e. the detected signals 21, is fed to a first neural network 101 which determines parameters of the first linear function 103 performing the decoding step in order to generate the encoded detected signals 30. These encoded detected signals 30 are again fed to a second neural network 201 which determines parameters of the second non-linear function 203. After applying the second non-linear function 203, reconstructed detected signals 301 are provided to the discriminator 29. In addition, original detected signals, i.e. a copy of the detected signals 21, are also provided to the discriminator 29.

The result of a comparison of the reconstructed detected signals 301 and the original detected signals 303 leads to a first feedback 105 and a second feedback 205 from the discriminator 209 which is respectively used by the first and second neural networks 101, 103. Due to this feedback, nodes of the neural networks 101, 201 are updated, and the parameters of the first and second functions 103, 203 are revised. Thus, a first learning step of the training procedure is completed.

The learning steps of the training procedure are repeated, e.g. by a further set of detected signals 21 provided for object 19A or object 19B, until the deviation between the original detected signals 303 and the reconstructed detected signals 301 is minimized.

In a second mode of operation of the system 10 (see FIG. 1), the output data of the decoding device 27, i.e. decoded signals 40 (see FIG. 2), is directly provided to the application algorithm 31, i.e. after completing the training procedure for the parameters of the first and second non-linear functions 103, 203. The training procedure is performed for the first time in a testing environment, i.e. before implementing the radar system 10 e.g. in an automated vehicle. In such a testing environment, the data transfer of the original detected signals 21, 303 can be easily performed via additional computational hardware which is typically not available in an automated vehicle. However, execution of the second mode of operation can be interrupted at a later stage, and the training procedure (e.g. using a reduced data set) can be repeated in order to verify the parameters of the first non-linear function 103 and the second non-linear function 203.

Since the encoded detected signals 30 or intermediate data representation Z (see FIG. 2) comprises a reduced quantity of data in comparison to the original detected signals 21 and the decoded signals 40, the transfer rate for transferring the encoded detected signals 30 from the receiving element 14 to the controller 26 is increased in comparison to a data transfer without encoding and decoding. In addition, the suppression of non-relevant data is performed by non-linear functions comprising parameters which are determined by a training procedure. Therefore, the unavoidable data loss due to auto-encoding and decoding via non-linear functions is automatically adapted to the required application. Therefore, no artifacts are introduced since no thresholds are arbitrarily set, e.g. corresponding to noise levels. Instead, the radar system 10 ensures that the decoded radar signals 40 or reconstructed detected signals 301 comprise maximum information required for the application algorithm used.

While the system and method has been described in terms of the preferred embodiments thereof, it is not intended to be so limited, but rather only to the extent set forth in the claims that follow.

We claim:

1. A radar system system comprising:
   at least one receiving element configured to detect reflected radar signals reflected by an object in a field-of-view of the system, wherein the receiving element is configured to generate detected signals indicative of the reflected radar signals detected by the receiving element;
   an auto-encoding device, embedded in the receiving element, configured to perform an auto-encoding operation on the detected signals such that the receiving element outputs the detected signals as encoded detected signals, the auto-encoding operation minimizing data loss while compressing the detected signals into the encoded detected signals.

2. The radar system according to claim 1, further comprising:
   a transfer device in communication with the receiving element; and
   a controller in communication with the transfer device, wherein:
   the transfer device configured to transfer the encoded detected signals from the receiving element to the controller, and
   the controller comprises a decoding device configured to perform a decoding operation to decode the encoded detected signals.

3. The radar system according to claim 2, wherein
   the auto-encoding device is further configured to apply a first non-linear function to the detected signals to encode the detected signals, and
   the decoding device is further configured to apply a second non-linear function for decoding the encoded detected signals.

4. The radar system according claim 3, wherein
   the first non-linear function is different from the second non-linear function.

5. The radar system according claim 3, wherein
   a first neural network derives parameters of the first non-linear function being applied in the auto-encoding operation, and
   a second neural network derives parameters of the second non-linear function being applied in the decoding operation.

6. The radar system according claim 5, wherein the controller comprises a discriminator configured to evaluate the parameters of the first non-linear function and the second non-linear function as part of a training procedure of the auto-encoding device and the decoding device.

7. The radar system according to claim 6, wherein the controller comprises at least one application algorithm for analyzing the detected signals; and the discriminator is further configured to use the application algorithm during the training procedure to evaluate the parameters for the first non-linear function and the second non-linear function.

8. The radar system according claim 7, wherein the at least one application algorithm comprises at least one algorithm for landmark classification, pedestrian classification, or bicycle classification.

9. A receiving element for detecting reflected radar signals, the receiving element comprising:
an embedded encoding device configured to encode detected signals into encoded detected signals via an auto-encoding operation that minimizes data loss while compressing the detected signals into the encoded detected signals.

10. A method for receiving and analyzing reflected radar signals, the method comprising:
detecting, via at least one receiving element, the reflected radar signals reflected by an object in a field-of-view of a radar system;
encoding the detected signals via an auto-encoding device that is embedded in the receiving element, the encoding minimizing loss of the detected signals while compressing the detected signals into encoded detected signals;
transferring the encoded detected signals to a controller;
decoding the encoded detected signals into decoded radar signals via a decoding device of the controller; and
analyzing the decoded radar signals via at least one application algorithm comprised by the controller.

11. The method according to claim 10, wherein the at least one application algorithm comprises at least one algorithm for landmark classification, pedestrian classification, or bicycle classification.

12. The method according to claim 10, wherein:
the encoding comprises applying a first non-linear function to the detected signals;
the decoding comprises applying a second non-linear function to the encoded detected signals; and
the first non-linear function is different from the second non-linear function.

13. The method according to claim 12, wherein:
the method is used as a part of a training procedure:
applying the first non-linear function comprises deriving parameters of the first non-linear function using a first neural network; and
applying the second non-linear function comprises deriving parameters of the second non-linear function using a second neural network.

14. The method according to claim 13, wherein deriving the parameters of the first non-linear function and the second non-linear function is performed by a discriminator comprised by the controller.

15. The method according to claim 14, further comprising using the application algorithm during the training procedure.

16. The radar system according to claim 7, wherein the application algorithm is further configured to analyze the decoded radar signals after the radar system has been implemented in an automated vehicle.

17. The radar system according to claim 7, wherein the discriminator is further configured to:
receive the detected signals and the decoded radar signals; and
apply the application algorithm to the detected signals and the decoded radar signals.

18. The radar system according to claim 17, wherein the discriminator is further configured to:
generate a first output of the application algorithm based on the detected signals;
generate a second output of the application algorithm based on the decoded radar signals; and
compare the first output and the second output.

19. The radar system according to claim 18, wherein the discriminator is further configured to, based on the comparison of the first output and the second output, update the parameters for the first non-linear function and the second non-linear function, the updated parameters resulting in minimizing deviation between the first output and the second output.

20. The method according to claim 15, wherein deriving the parameters of the first non-linear function and the second non-linear function further comprises:
receiving, by the discriminator, other detected signals and other decoded detected signals;
applying the application algorithm to the other detected signals and the other decoded detected signals;
generating a first output of the application algorithm based on the other detected signals;
generating a second output of the application algorithm based on the other decoded detected signals;
comparing the first output and the second output; and
based on the comparing, revising the parameters for the first non-linear function and the parameters for the second non-linear function, the revised parameters resulting in minimizing deviation between the first output and the second output.

* * * * *